United States Patent [19]

Belohoubek et al.

[11] Patent Number: 4,641,106
[45] Date of Patent: Feb. 3, 1987

[54] RADIAL POWER AMPLIFIER

[75] Inventors: Erwin F. Belohoubek, Middlesex County; Daniel W. Bechtle, Mercer County, both of N.J.

[73] Assignee: RCA Corporation, Princeton, N.J.

[21] Appl. No.: 736,302

[22] Filed: May 21, 1985

[51] Int. Cl.[4] .............................................. H03F 3/60
[52] U.S. Cl. .................................... 330/286; 330/295; 333/128; 333/251
[58] Field of Search ................... 330/53, 56, 286, 287, 330/289, 295; 333/128, 136, 137, 246, 251

[56] References Cited

U.S. PATENT DOCUMENTS

| | | | |
|---|---|---|---|
| 3,733,560 | 5/1973 | Oltman, Jr. et al. | 330/56 X |
| 3,783,401 | 1/1974 | Oltman, Jr. | 330/56 |
| 3,873,934 | 3/1975 | Oltman, Jr. et al. | 330/56 |
| 3,873,935 | 3/1975 | Oltman, Jr. | 330/56 |
| 3,958,247 | 5/1976 | Bogner et al. | 343/754 |
| 4,234,854 | 11/1980 | Schellenberg et al. | 330/286 |
| 4,263,568 | 4/1981 | Nemit | 333/127 |
| 4,282,491 | 8/1981 | MacMaster et al. | 330/286 |
| 4,291,278 | 9/1981 | Quine | 330/286 |
| 4,371,845 | 2/1983 | Pitzalis, Jr. | 330/286 X |
| 4,424,496 | 1/1984 | Nichols et al. | 330/286 |

OTHER PUBLICATIONS

Article entitled "Radial Combiner Runs Circles Around Hybrids" by: B. J. Sanders, published in Microwaves Magazine, Nov. 1980, pp. 55-58.
Article entitled "Microwave Power Combining Techniques" by: Kenneth Russell, published in IEEE Transactions on Microwave Theory and Techniques, vol. MTT-27, No. 5, May 1979, at pp. 472-478.
Article entitled "A 6-GHZ 80-W GaAs FET Amplifier with TM-Mode Cavity Power Combiner" by: Okubo et al., published 1983, IEEE MTT's Digest, pp. 276-278.
Article entitled "MIC Power Combiners for FET Amplifiers" by: Quine et al.
Article entitled "A Wideband Radial Power Combiner for FET Amplifiers" by: Schellenberg et al., published in 1978 in IEEE International Solid-State Circuits Conference Digest of Technical Papers, pp. 164-165.
Article entitled "A 10 Watt Broadband FET Combiner/Amplifier" by: Cohn et al., pp. 292-297, MTT-S Symposium Digest, 1979, Orlando, Florida.
Article entitled "An 18 GHZ 8-Way Radial Combiner" by: I. Stones et al., published in the 1983 IEEE MTT-S Digest, pp. 163-165.
Article entitled "60-Way Radial Combiner Uses No Isolators" by: Stephen I. Foti et al., Microwaves & RF, Jul. 1984, pp. 96, 97, 99, 100, 118.

Primary Examiner—James B. Mullins
Attorney, Agent, or Firm—Joseph S. Tripoli; Robert L. Troike; William H. Meise

[57] ABSTRACT

A radial power amplifier includes a coaxial input port and a radial power splitter. The radial power splitter includes a radial transmission line and a number of radial transmission line to microstrip transitions spaced about the radial transmission line for splitting input signal equally among a number of microstrip terminals. A like number of amplifier modules have their input terminals coupled to the microstrip terminals by intermediary coaxial transmission lines. A radial power combiner symmetrical with the radial power splitter includes a second set of microstrip terminals, one terminal being adjacent the output terminal of each amplifier module. The second set of microstrip terminals is coupled by a microstrip to radial transmission line transition to a second radial transmission line. The amplified signals from the amplifier modules converge along the second radial transmission line towards the common output port at which the amplified signal appears.

17 Claims, 16 Drawing Figures

RADIAL POWER AMPLIFIER

BACKGROUND OF THE INVENTION

This invention relates to radial power splitters and combiners and to amplifiers using radial power splitters and radial power combiners in conjunction with amplifier modules.

Earth satellites are finding increasing use as transponders for communications systems. The use of satellites for communication links between cities eliminates the need for land communication cables, which are very costly. In order to provide continuous coverage, a satellite must be in a geosynchronous orbit. Such orbits require that the satellite be at an altitude of about 22,000 miles. Thus, communications by way of a geosynchronous satellite requires transmission over a path length of 22,000 miles to the satellite and transmission from the satellite over a 22,000 mile path length to the receiving Earth station. Transmission over such a distance requires relatively high antenna gain. The necessary gain is achievable with antennas of reasonable size and reasonable cost only at microwave frequencies and frequencies higher than microwave.

The transmission of signal from the satellite to the Earth station requires a power amplifier located in the satellite capable of generating tens or hundreds of watts of microwave power with great reliability. In the past, the microwave power was generated by travelling wave tubes (TWT). Travelling wave tubes were, and continue to be, used for satellite transmitters notwithstanding the reliability problem attributable to the inherent degregation resulting from operation over a period of time. More recently, solid state power amplifiers (SSPA) have been used at lower microwave frequencies, such as at C-band, instead of travelling wave tubes. The SSPA has no inherent degradation mechanism so is more reliable than the TWT. A need exists to provide solid state power amplifiers at X-band (around 10 GHz) and at millimeter wave frequencies.

Solid state power amplifiers are implemented by using a large number of relatively low power solid state devices. Each solid state device provides a small portion of the total output power, and power combiners are used to combine the powers from each of the individual solid state devices to generate the desired amount of signal power at microwave or millimeter wave frequencies.

Various types of power combiners are described in the article "Microwave Power Combining Techniques" by Kenneth J. Russell, published in the IEEE Transaction Microwave Theory and Techniques, May 1979. In the Russell article, corporate or tree combiners are described as being useful for combining a small number of devices but as being very inefficient as the number of devices combined increases. Similarly, the chain type of combiner is not useful. Russell also describes resonant and nonresonant N-way combiners. Along the more successful techniques for combining power which he describes are the cavity combining technique. However, this technique has limited bandwidth.

One problem associated with SSPA amplifiers for satellite applications is that of heat dissipation. Water cooling is not practical in a space environment, and there is little or no atmosphere to provide convection cooling. As a practical matter, all cooling of the amplifier modules of an SSPA for space use must be accomplished by conduction. It is a complex problem to make a broadband SSPA which is reliable, small, easily serviced and tested when on the ground prior to launch, and in which the heat dissipated by the active elements is carried away by conduction.

U.S. Pat. No. 4,291,278 issued Dec. 22, 1981, to Quine describes a power amplifier including a feed waveguide, a fin-line array transition from waveguide to microstrip, a plurality of amplifiers each of which is fed from microstrip, a plurality of phase shifters at the output of the amplifiers for compensating phase, and a fin-line array transition from microstrip to waveguide. This structure requires a phase compensator for each amplifier in order to compensate for the different path lengths from the common feed point to each amplifier, and has the additional problem of requiring alignment of the phase compensators. Furthermore, each phase compensator presumably has a different loss and this results in combination of unequal powers. As the number of amplifiers increase from a few to a very large number, the linear dimensions of the Quine amplifier increase proportionally and it can be very large. Also, the length of the transmission lines to and from the amplifier most remote from the feed point tends to reduce the effectiveness of the structure in combining the power.

A power amplifier is desired which is easy to manufacture and suitable for use at microwave and millimeter wave frequencies, which has relatively small linear dimensions when large numbers of amplifier modules are used, in which each amplifier module is provided with positive heat sinking, and each module can be accessed for maintenance without substantial disassembly of the structure.

SUMMARY OF THE INVENTION

A power amplifier includes an input port centered on an axis and adapted for receiving signals to be amplified. A first radial transmission line is centered on the axis and is coupled to the input port for propagating the signal to be amplified radially away from the input port. A radial transmission line to microstrip transition is centered on the axis and coupled to the radial transmission line at a point remote from the input port for coupling a portion of the signal to be amplified to each terminal of a number of microstrip terminals. An equal number of coaxial transmission lines is provided. One end of each of the coaxial transmission lines is coupled to one of the microstrip terminals. Each coaxial transmission line extends at right angles to the microstrip line and parallel with the axis of the structure. The structure also includes an output port centered on the axis. A second radial transmission line is centered on the axis and is coupled to the output port for propagating the amplified signal towards the output port. A microstrip transmission line to radial transmission line transition is centered on the axis for receiving a portion of the amplified signal at each of a number of microstrip terminals for coupling those portions of the amplified signal to the second radial transmission line for propagation towards the output port. A number of amplifier modules equal to the number of microstrip terminals is coupled between the other end of the coaxial transmission lines and the second set of microstrip terminals for receiving one of the portions of the signal to be amplified and for amplifying it to produce one of the portions of the amplified signal.

DETAILED DESCRIPTION OF THE INVENTION

Figure 1:
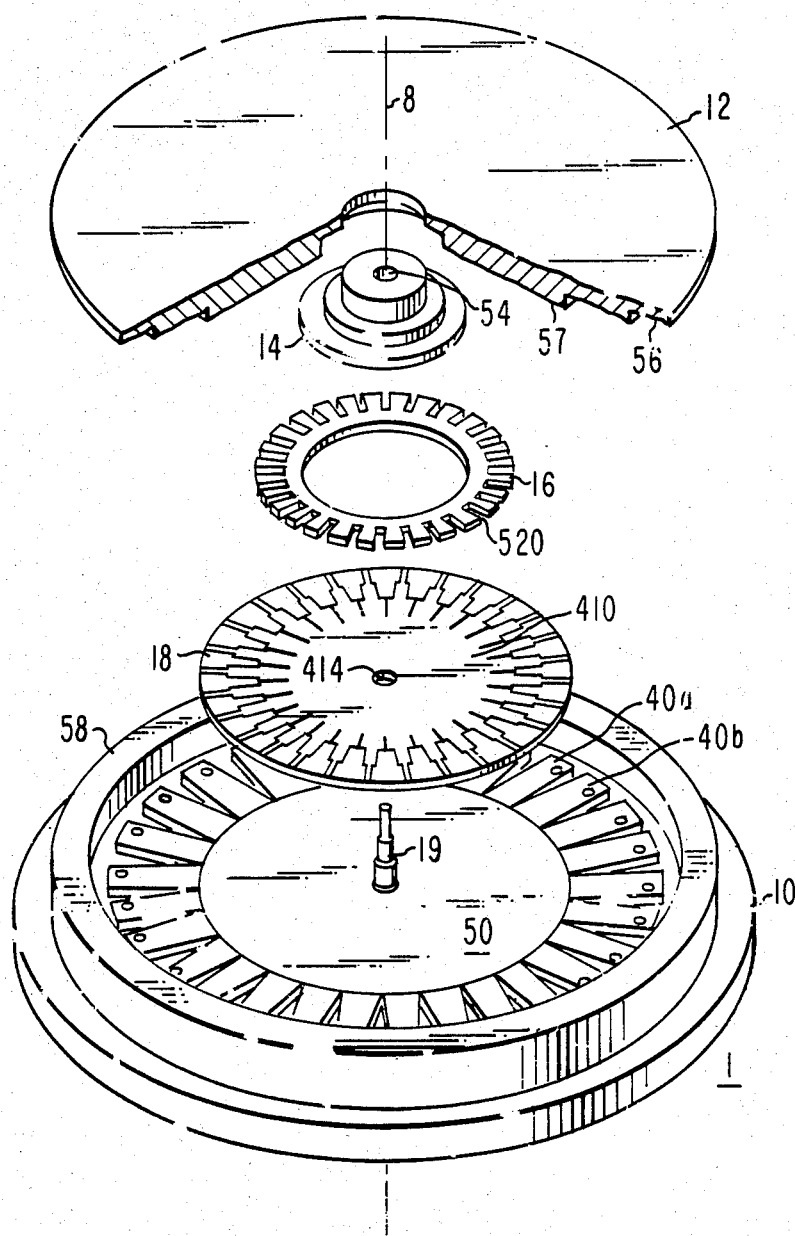
FIG. 1 is a simplified exploded view of the top portion of an amplifier according to the invention.
Figure 2:
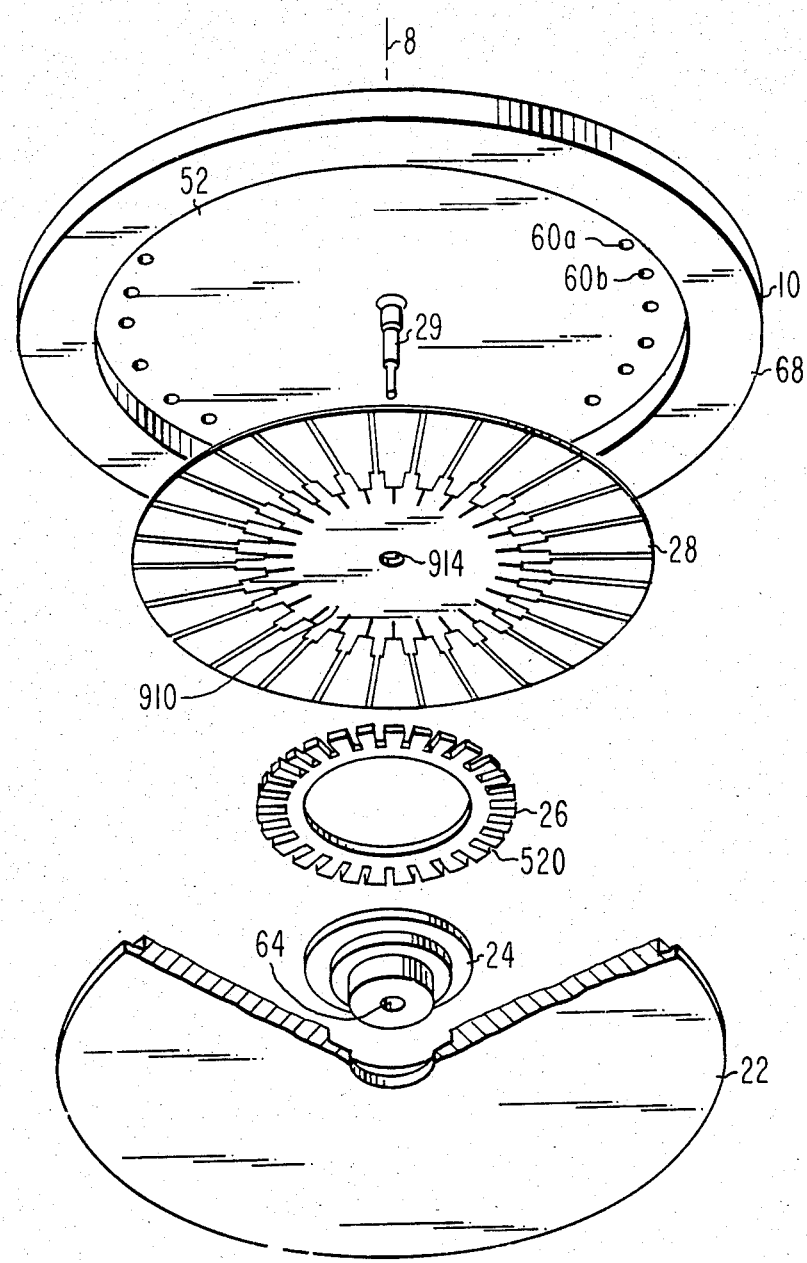
FIG. 2 is a simplified exploded view of the bottom portion of an amplifier according to the invention.
Figure 3A:
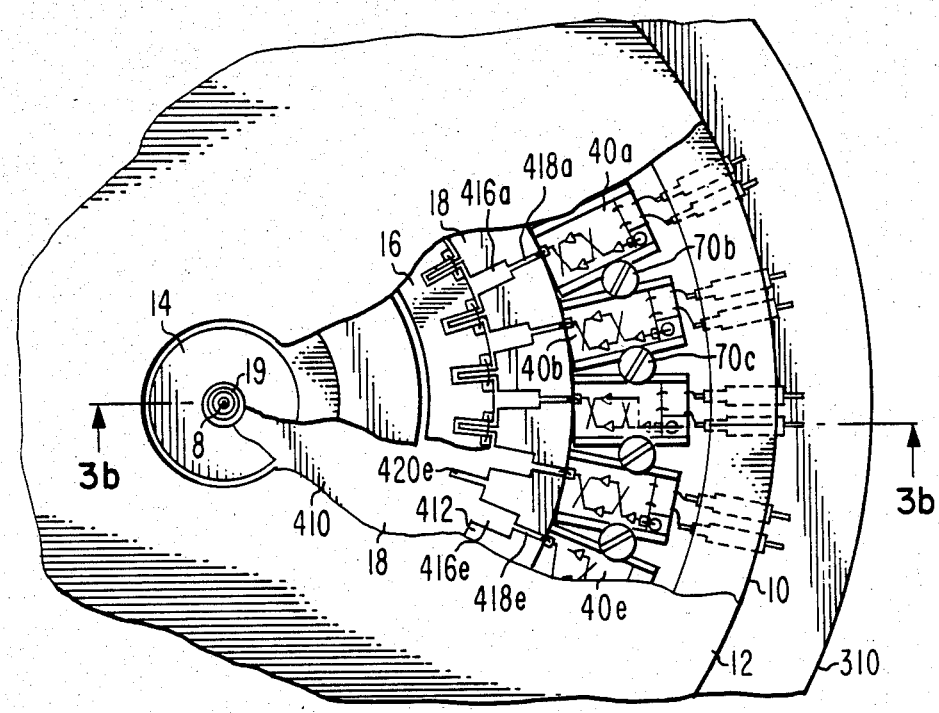
FIG. 3a is a plan view, partially cut away, of a portion of the amplifier illustrated in FIGS. 1 and 2.
Figure 3B:
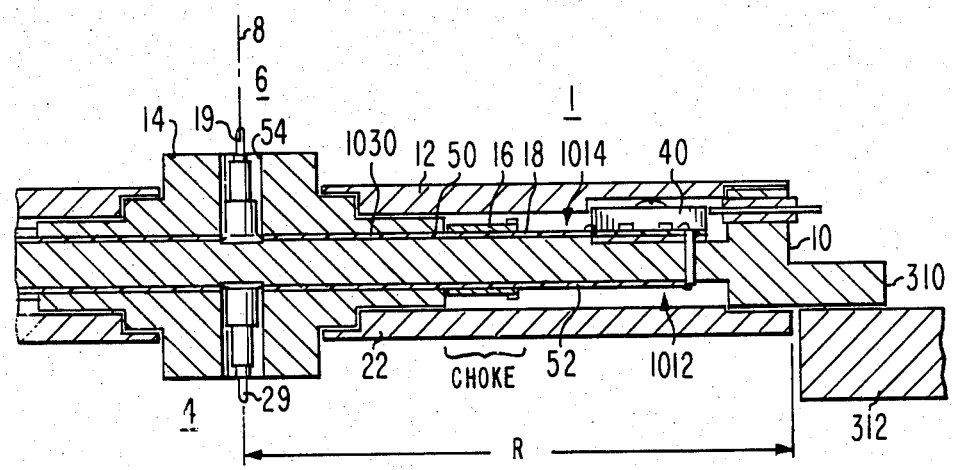
FIG. 3b is an elevation view of a cross-section of the arrangement of FIG. 3a taken along lines b—b.

FIG. 1 is an exploded view of the top half of a radial power amplifier 1 according to the invention, and FIG. 2 is an exploded bottom view. FIG. 3a is an elevation view of a portion of the structure of amplifier 1, partially cut away to show the interior, and FIG. 3b is an elevation view of a section of the portion illustrated in FIG. 3a. In FIGS. 1–3, a generally disc-shaped conductive central member 10 includes flat disc-like portion 50 and a corresponding bottom disc-like portion 52 centered on an axis 8. A conductive center pin 19 of a coaxial output port 6 is coupled to the center of disc-like portion 50 of center member 10. A printed circuit board 18 having a copper pattern 410 etched on its upper surface is mounted on disc-like surface 50 with pin 19 protruding through central aperture 414. Details of printed-circuit board 18 are described in conjunction with FIG. 4. A copper ring 16 is mounted atop printed circuit board 18. Ring 16 has radial slots 520, extending radially inward from the outer periphery of the ring. Slots 520 of ring 16 are aligned with printed circuit pattern 410 as described below. Ring 16 is maintained centered on axis 8 by a conductive stepped flange 14. The steps of flange 14 provide surfaces for mounting a conductive cover 12 by means of screws (not shown), and a central aperture 54 of flange 14 forms the outer conductor of coaxial output port 6 of the amplifier. The lower portion of top cover 12 includes a conductive stepped portion 56 machined to mate with a circumferential flange 58 formed integrally with central member 10. When assembled, lower surface 57 of cover 12 is held firmly against conductive pattern 410 on the top of printed circuit board 18. A plurality of amplifier modules 40a, 40b, 40c ... is arranged in circumferential fashion between surface 50 and flange 58, with the input end of each amplifier module nearest flange 58 and the output end adjacent to surface 50.

The bottom half of the amplifier structure is generally similar to the upper half. Referring to FIG. 2, central member 10 includes a lower disc-like surface 52 and a center conductor pin 29 of an input port designated generally as 4 extending from the center thereof. A circumferential flange 68 which is an integral portion of central member 10 provides a surface for mounting a conductive bottom cover 22 by means of screws (not shown). A printed circuit board 28 having a copper pattern 910 etched onto the lower side thereof is mounted against surface 52 with center conductor pin 29 of input port 4 protruding through central aperture 914. Details of the pattern on board 28 are illustrated in conjunction with FIG. 9. It should be noted that printed circuit board 28 is larger in diameter than printed circuit board 18. The edge of printed circuit board 28 when mounted on surface 52 is adjacent the centers of through holes 60. Holes 60 are parallel to axis 8 and traverse through member 10 from surface 52 to surface 50. These holes form the outer conductors of coaxial transmission lines designated 708, as illustrated in conjunction with FIGS. 3b and 7. A copper heat sinking disk 26 identical with disc 16 is mounted on the lower surface of printed circuit board 28 with its radial slots 520 aligned with the printed pattern of board 28. The uppermost step of a conductive stepped flange 24 fits within the inner diameter of ring 26 and holds it in a centered position. Central aperture 64 of flange 24 forms the outer conductor of input port 4 of the amplifier structure. Another step of flange 24 provides a seat for bottom cover 22. Central member 10 includes a circumferential flange portion designated 310 in FIG. 3 to which a thermally conductive heat sinking structure 312 may be thermally fastened as illustrated in FIG. 3b.

Figure 4:
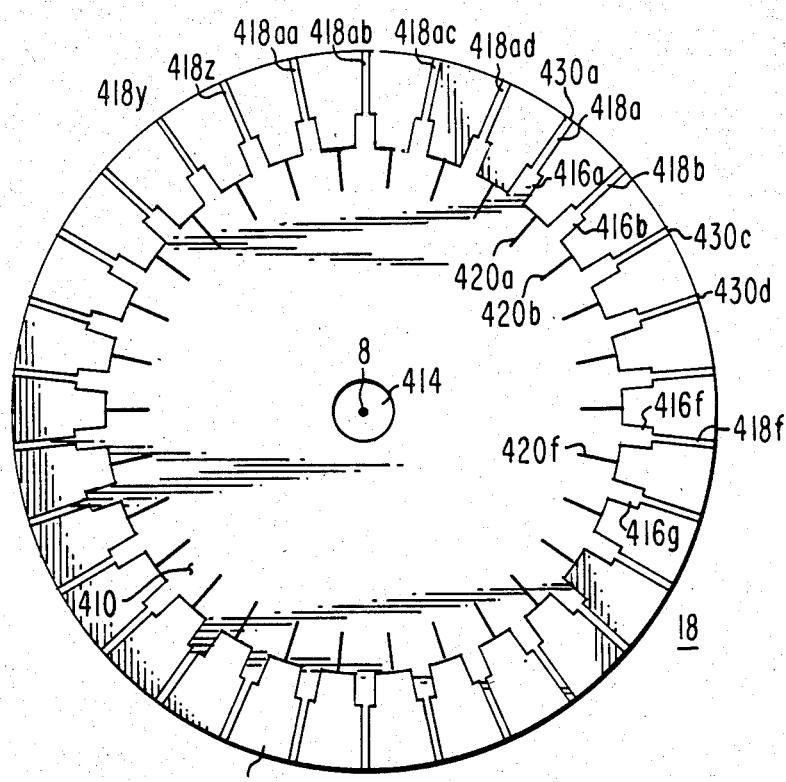
FIG. 4 illustrates the pattern of a printed circuit board which is a portion of the arrangement illustrated in FIGS. 1 and 3.

FIG. 4 illustrates details of printed circuit board 18. Printed circuit board 18 has a copper pattern 410 formed on one side of a circular disc 412 of dielectric material by a process such as photolithography and etching. Board 18 has a central aperture 414 and is circularly symmetrical with respect to axis 8. A conductive pattern defined by region 410 includes a conductive region extending from the periphery of central aperture 414 to the inner edges of peripheral radial slots 420, and includes wide conductive regions 416 and narrow conductive regions 418 extending from the periphery of conductive region 410 to the edge of board 18. There are 30 conductive regions 418, one for each amplifier module.

Figure 10:
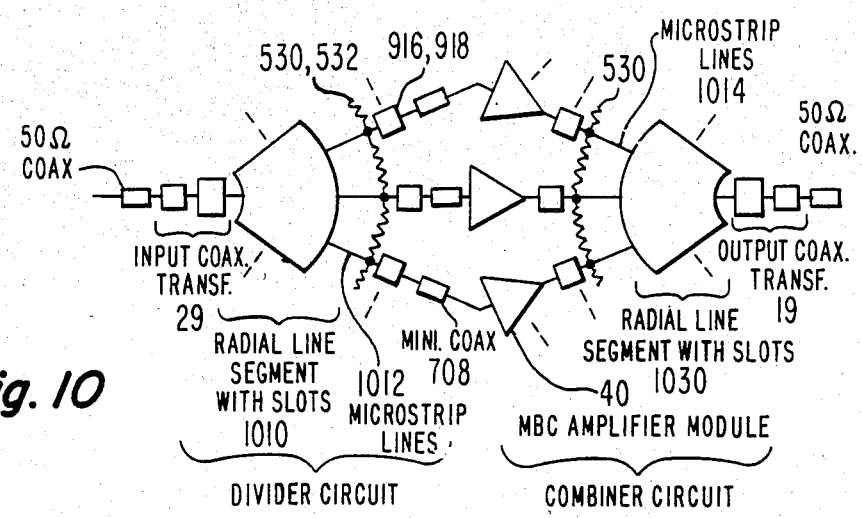
FIG. 10 is a schematic diagram of the arrangement illustrated in FIGS. 1 and 3.

Printed circuit board 18 when mounted on upper surface 50 of central member 10 forms a radial transmission line or waveguide 1030 lying between surface 50 and conductive region 410. Radial transmission line 1030 extends radially away from output port 6. The elongated portions 416 and 418 coacting with surface 50 form microstrip transmission lines designated generally as 1014 in FIG. 10.

The end of each narrow conducting region 418 remote from axis 8 defines a microstrip terminal or port when printed circuit board 18 is mounted on surface 50. The terminals are designated 430a, 430b ... in FIG. 4. There are 30 microstrip terminals associated with printed circuit board 18.

Excellent symmetry can be achieved between the radial transmission line and the 30 microstrip lines, because the entire structure is defined by the conductive pattern formed on the printed circuit board. A structure intended for operation at 10 GHz and above the structural details of small size. These details can be drawn in large scale and photographically reduced in size to form a master pattern, which is then transferred by photolithography to form the metal pattern on the printed circuit board.

The dielectric material of board 18 is selected for satisfactory propagation at the frequency of interest. For an embodiment of the invention intended for operation in the region of 8 to 14 GHz, the printed circuit board is made out of Duroid manufactured by Rogers Company. The dielectric constant of the material is 2.2.

Figure 7:
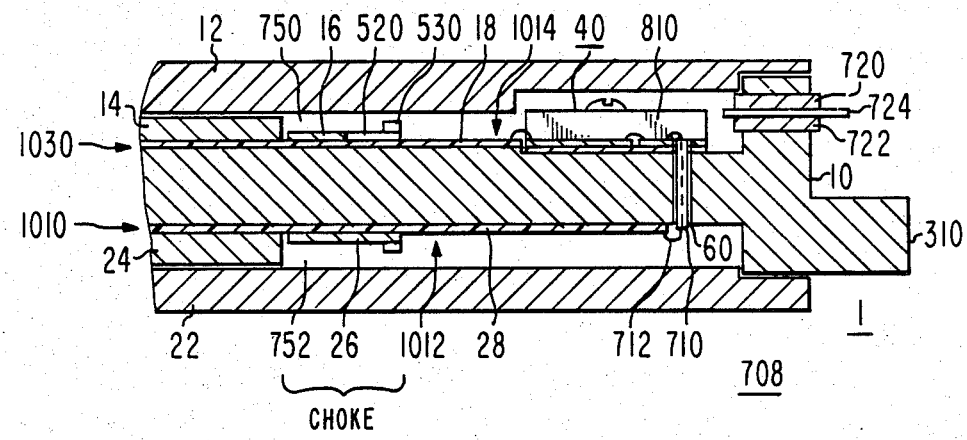
FIG. 7 is an elevation view of a cross-section of a portion of the amplifier of FIGS. 1 and 3 illustrating details of an axially oriented coaxial transmission line and its location relative to an amplifier module.

A radial choke designated as 750 in FIG. 7 has a lower wall formed by the top surface of ring 16 and a top wall formed by that portion of the lower surface of top cover 12 facing ring 16. A portion of stepped flange 14 sandwiched between cover 12 and printed circuit board 18 short-circuits the end of radial choke 750. Choke 750 aids in the transition of signal between radial transmission line 1030 and microstrip transmission line 1014. A corresponding choke 752 is formed on the lower portion of amplifier 1 by facing surfaces of ring 26 and bottom cover 22 in conjunction with a portion of flange 24.

Radial slots 420 in the conductive pattern of printed circuit board 18 have a length of one quarter wavelength at the center of the frequency of interest, which is 12 GHz for the above-mentioned embodiment. Slots 420 insure isolation between the microstrip ports 430. Under conditions of perfect symmetry, in which all amplifier modules provide identical performance and each amplifier is driven with equal signal energy, the fields on each side of each slot will be identical, so no field component exists tending to cause a signal current flow across any slot. It is desirable to dissipate the signal energy represented by currents tending to flow across the slots, and thereby to restore symmetry and prevent circulation of signal energy in a circumferential direction.

Figure 5:
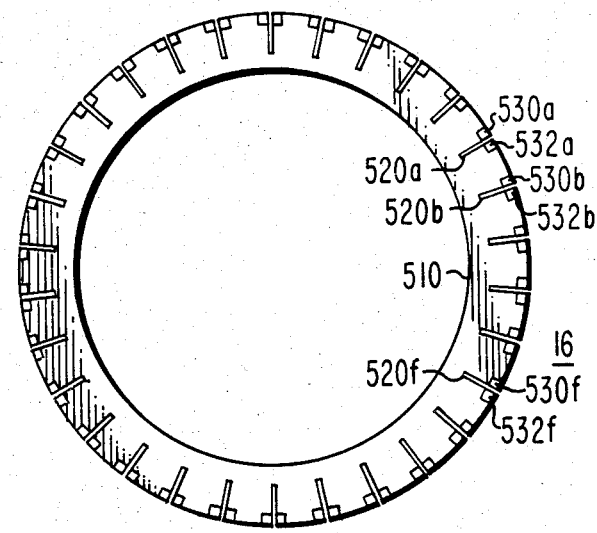
FIG. 5 illustrates a heat sink ring which is associated with the printed circuit of FIG. 4.

It has been discovered that chip resistors mounted across slots of printed circuit board 18 tended to be destroyed under high power conditions. The thickness of the metal plating is approximately 0.0005 inch (0.013 mm). The poor performance appears to be due at least in part to poor thermal contact between the chip resistor and the copper plating of pattern 410 which allows the temperature of the resistor to rise to a destructive level. This problem is solved by the use of thick film resistors fired at high temperature directly onto the heat sink, thereby providing excellent thermal bonding to the heat sink. The firing temperature of approximately 800° C. is so high it would destroy the dielectric material of printed circuit 18. This problem is solved as illustrated in FIG. 5 by firing thick film resistors 530 and 532 on each side of slots 520 of a copper heat sinking ring 16. Slots 520 are slightly wider and slightly longer then the nominal size of slots 420, so that the effective size and position of each slot for purpose achieving circular symmetry is controlled by the printed circuit rather than by the ring as is made more clear by FIG. 6. After resistors 530 and 532 are fired onto the surface of ring 16, a bonding pad (visible in FIG. 5 as a small white area in the center of each resistor) is deposited onto each resistor to provide an ohmic contact point. During the amplifier assembly process, copper ring 16 is registered with pattern 410 as described below and soft-soldered thereto at a temperature which does not damage the dielectric material of printed circuit board 18.

Figure 6:
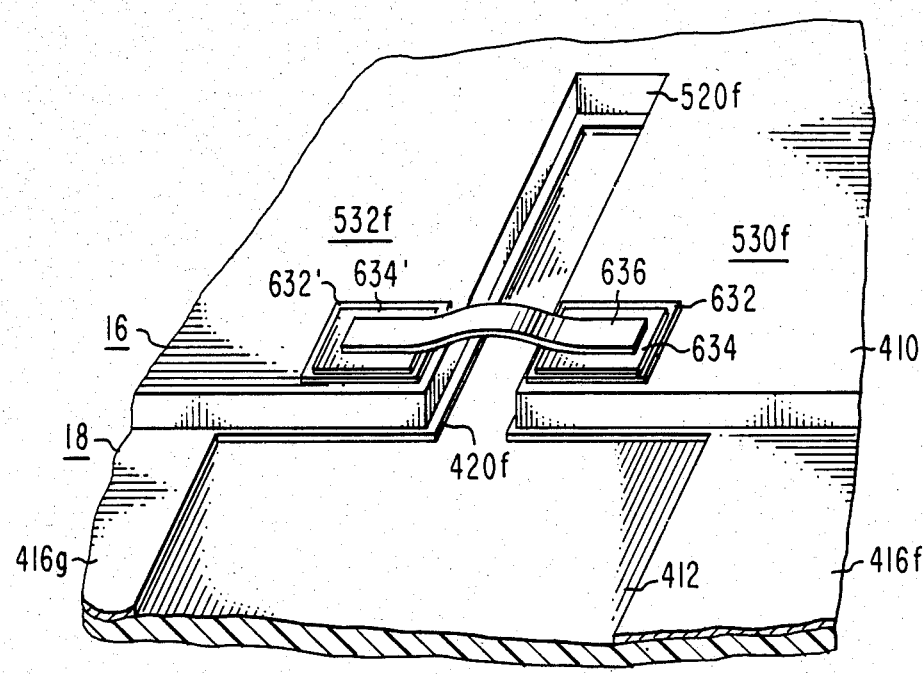
FIG. 6 is a view of a portion of the ring of FIG. 5 mounted on the printed circuit board of FIG. 4, showing details of isolation resistors and a bonding strap mounted on the ring.

FIG. 6 is a view of a portion of copper ring 16 and the associated portion of printed circuit board 18 near one of the choke slots after assembly. Dielectric material 412 of printed circuit board 18 is visible in the foreground, with a portion of wide conductor 416f on the right and a portion of wide conductor 416g on the left. Printed slot 420f lies between wide conductor 416f and 416g. Slot 520f of copper ring 16 is registered with slot 420f. Because slot 520f is slightly larger than slot 420f, a small portion of the plating of printed circuit board 18 near slot 420 is not covered by copper ring 16. Consequently, small variations in slots 520 due to unavoidable machining tolerances do not affect the precision of the resulting slot, which is defined by the printed pattern of board 18. Resistor assembly 530f includes fired thick-film resistor 632 and bonding pad 634, while resistor assembly 532f includes resistance material 632' and bonding pad 634'. A bonding strap 636 bridges bonding pads 634 and 634'. This arrangement provides extremely good heat sinking for resistor 530f and resistor 532f. Since there are two resistor assemblies of equal size formed at the same time from the same material, their resistances are equal and the power is divided equally between the two portion of the series connected resistors. Thus the heat generated due to circulatory operating modes is divided equally and sunk to the copper ring on opposite sides of each slot.

FIG. 7 illustrates in cross-sectional view details of amplifier 1. in FIG. 7, a coaxial transmission line 708 including a dielectric material 710 and center conductor 712 passing through an aperture 60 is visible, as well as the connections of the ends of center conductor 712 to structures above and below central member 10.

Also visible in FIG. 7 is one of the filters 720 by which direct (DC) bias voltage is applied to the amplifier modules. As known, the bias filter prevents the leakage of microwave energy from the amplifier to the power supply. Filter 720 includes a dielectric material 722 and a conductor 724. The high dielectric constant of material 722 forms a shunt capacitor which attenuates high frequency signals which may attempt to flow through the filter. More complex filters may also be used, such as those which include magnetic materials.

The application of bias voltage to the amplifier modules causes power dissipation. This power dissipation tends to be large for amplifier modules used for amplifying frequencies of several GHz and higher frequencies, because of the relatively low DC-to-signal conversion efficiency. The high power dissipation tends to raise the temperature of the amplifier modules, which tends to cause degradation and failure.

Figure 8:
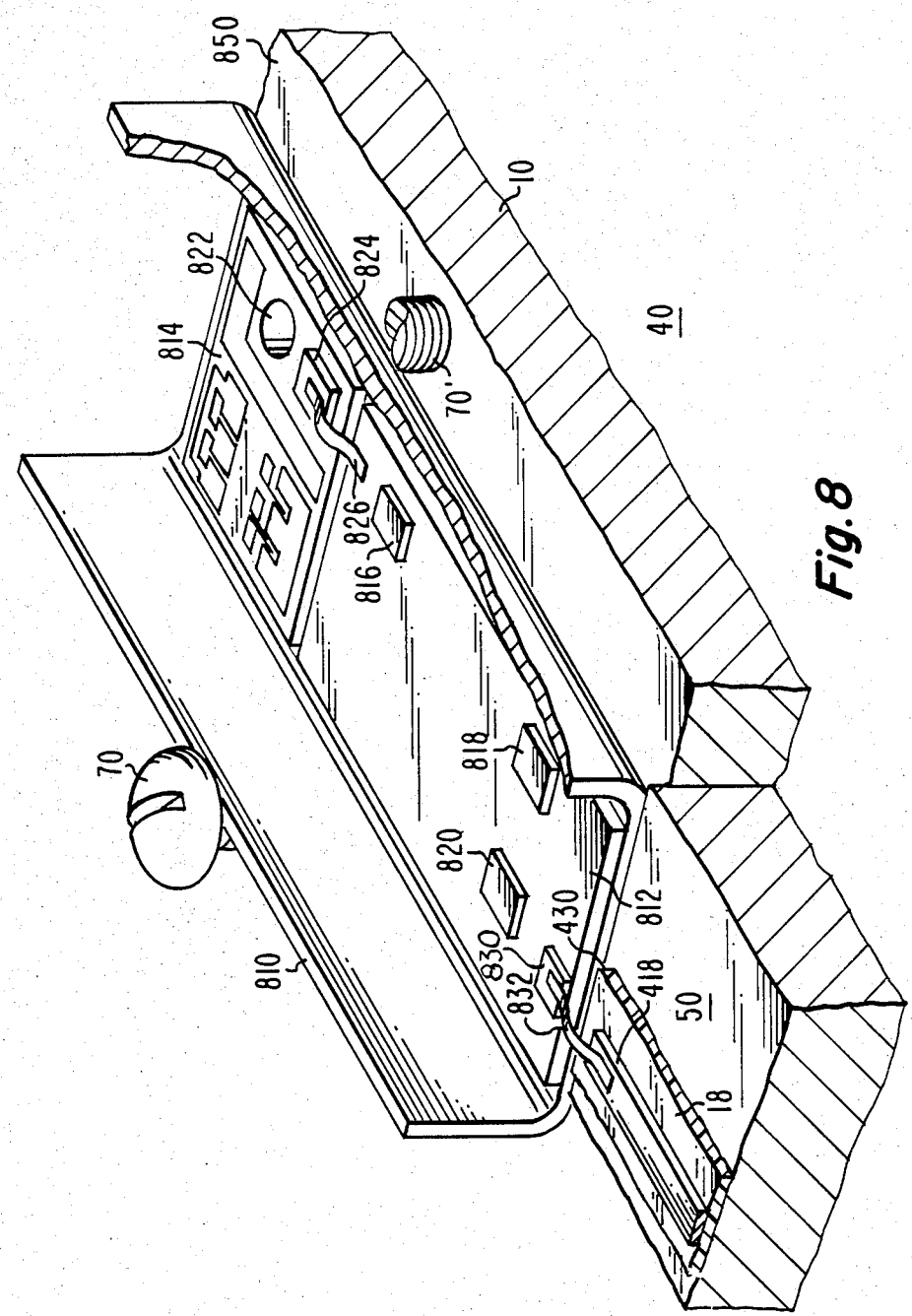
FIG. 8 is a simplified isometric view of a section of the amplifier of FIGS. 1 and 3 illustrating details of an amplifier module and its relationship to other portions of the amplifier.

One amplifier module 40 out of the 30 such modules arrayed about the periphery of printed circuit board 18 is illustrated in greater detail in FIG. 8. Amplifier module 40 includes a U-shaped channel or carrier 810, a portion which is cut away to reveal a MIC (microwave integrated circuit) Beryllium Oxide substrate 812 bonded to the bottom of channel 810 and a further printed circuit board 814 formed from the aforementioned Duroid material. Substrate 812 is loaded with the active amplifying elements. As illustrated, three active elements 816, 818, 820 are used. The Beryllium Oxide provides a low thermal resistance path between active elements 816–820 and the bottom of channel 810, from which the heat produced by the active devices is carried away by central member 10 against which channel 810 is pressed by screws 70 and 70'. Printed circuit board 814 includes an aperture 822 positioned over hole 60 formed in central member 10. Aperture 822 when so arranged can receive the center conductor 712 of a coaxial transmission line 708. A bonding pad 824 is arranged adjacent aperture 822 for receiving the center conductor. A bonding jumper 826 connects bonding pad 824 to the input structure (not illustrated) of substrate 812. The signal is amplified by circuits (not specifically illustrated but well known in the art) printed on and bonded to substrate 812, and the signal so amplified is made available at an output bonding pad 830 and connected by means of a bonding wire 832 to a microstrip terminal 430, which is the end of a printed conductor 418 on printed circuit board 18.

The thickness of substrate 812 equals the thickness of printed circuit board 814 and also equals the thickness of printed circuit board 18. Consequently, in order for the upper surface of substrate 812 to be at the same level as the upper surface of printed circuit board 18 for least signal attenuation at the transition between board and substrate, carrier 810 is mounted in a slight depression in upper surface 50 of central member 10. Upper surface 50 is raised above surface 850 as illustrated in the sectional view of FIG. 8 by the thickness of the walls of carrier 810. Thus, the inside bottom of carrier 810 is at the same level as upper surface 50 of central member 10, and may be considered an extension thereof.

The amplifier modules so arranged can be accessed for test by simply removing amplifier top cover 12. Any module may be removed for replacement by removing the connections to bonding pads 824 and 830 and removal of two screws 70.

Figure 9:
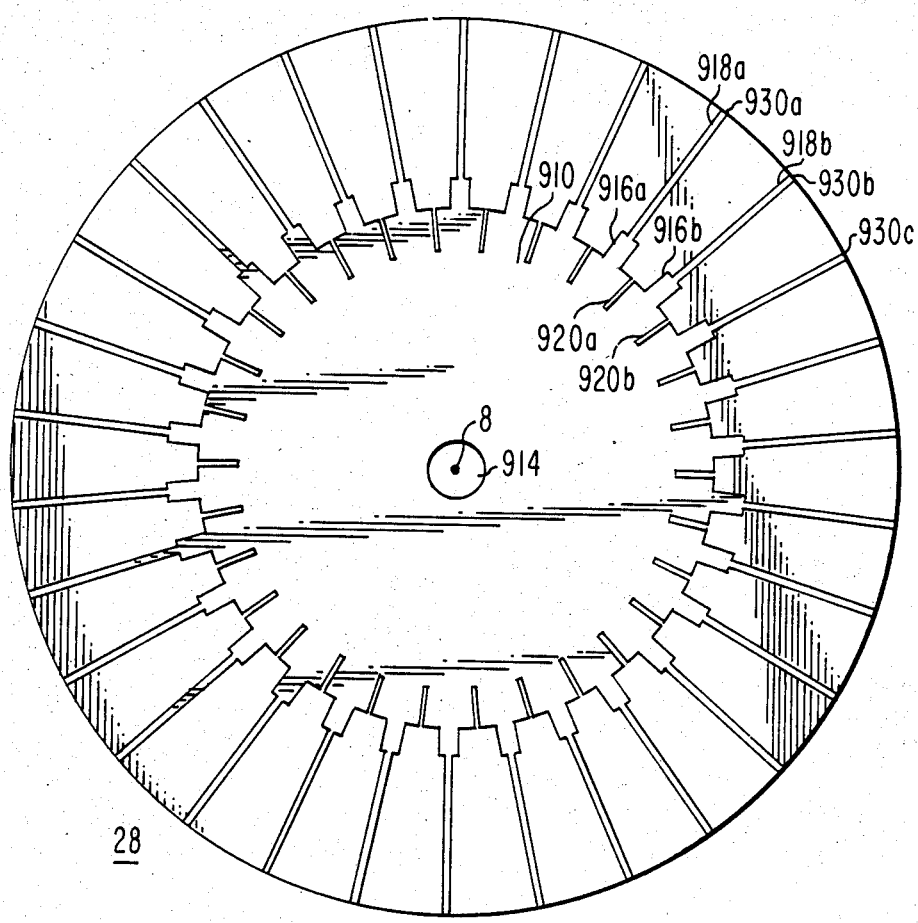
FIG. 9 illustrates the pattern of another printed circuit board which is a portion of the arrangement of FIGS. 1 and 3.

FIG. 9 illustrates details of printed circuit board 28. Printed circuit board 28 has a larger diameter than printed circuit board 18, as best seen in FIG. 7. The conductor pattern 910 of printed board circuit 28 is identical to that of printed circuit board 18, except that narrow conductive fingers 918 are longer than conductive fingers 418. The end of each conductive finger 918 forms a microstrip terminal 930 when printed circuit board 28 is mounted on surface 52. Copper ring 26 is identical to copper ring 16 illustrated in FIG. 5, and the slots 520 therein are registered with the slots 920 of conductive pattern 910 and the ring (and its associated resistors) is soldered thereto as described in conjunction with FIGS. 4 and 5.

When assembled, the arrangement described in conjunction with FIGS. 1 through 9 forms an amplifier in which coaxial input port 4 is defined by pin 29 and aperture 64, and output port 6 is defined by pin 19 and aperture 54. Signal propagating into input port 4 encounters a radial transmission line in which lower surface 52 of central member 10 is one conductor and the other conductor is the central portion of conductive pattern 910 of printed circuit board 28. This is illustrated schematically as 1010 in FIG. 10. The steps of pin 29 are selected to provide an impedance transformation between 50 ohms and the input end of the radial transmission line 1010. The input power spreads symmetrically through the radial transmission line, and divides equally into 30 portions.

Any unbalance in the signal arriving at the end of the radial transmission line causes a signal imbalance which causes a current flow in resistors 530 and 532, which dissipates signal power and which tends to restore signal balance. The balanced signals propagate through the microstrip lines formed by conductive fingers 916 and 918 co-acting with lower surface 52 of central member 10. That portion of the input signal arriving at a microstrip terminal 930 at the end of a conductive finger 916 is coupled to the center conductor of a coaxial section 708 such as that illustrated in FIG. 7. The step in width of conductive segments 916 and 918 provides a further impedance transformation between the radial transmission line 1010 and the end of miniature coaxial cable 708. Each coaxial transmission line 708 propagates a signal parallel with axis 8 to upper surface 50 of central member 10 (actually to the upper surface of 810, which is continuous with upper surface 50 as described above). Each portion of the signal is amplified by an amplifier module 40 and the amplified signal portion is coupled to a microstrip terminal 430 at the end of a conductive portion 418 of printed board 18 co-acting with top surface 50 of central member 10. The signal propagates along a second microstrip transmission line including conductive member 418 and a wider conductive member 416 coacting with top surface 50, which together provide impedance transformation to a second radial transmission line or waveguide 1030 formed by the conductor pattern 410 of printed board 18 coacting with upper surface 50. The signals from all of the amplifier modules converge towards and are summed at output port 6.

As described, the power loss between the output terminal of each amplifier module and common output port 6 is minimized by comparison with a structure in which there are transmission line connectors or right-angle bends in the transmission lines leading from the output port of each amplifier module to the power combining point at output port 6. Connectors such as types BNC,N and others cause additional insertion loss. Simple bends have also been found to result in unavoidable power loss. The transitions between each coaxial transmission line 708 and microstrip terminals 430 at the bottom and each bonding pad 824 at the top include right angle bends and therefore include loss. By having these bends on the input side of each amplifier module, additional bias need not be provided to the amplifier modules to produce amplified signal which is then dissipated in bends. Thus, the amplified power from each amplifier module is utilized to the maximum and the power dissipation of the amplifier as a whole is minimized. The effect of the signal losses due to the bends at the top and bottom of each coaxial line 710 is to slightly degrade the gain of the power amplifier. This may be overcome by use of more preamplification.

FIGS. 11-15 are plots of performance of 30-way power splitters and dividers as illustrated in FIGS. 1-3 and 7. The dimensions of various parts of the structure are as follows:

| | |
|---|---|
| Overall Radius R (FIG. 3b) | 6.0 cm |
| Height across covers 12 and 22 | 1.4 cm |
| Thickness of printed boards 18 and 28 .010 in | 0.25 mm |
| Radius of printed board 18 | 3.8 cm |
| Radius of printed board 28 | 4.3 cm |
| Length of slots 420 | 0.46 cm |
| Inner diameter of ring 16 | 1.75 cm |
| Outer diameter of ring 16 | 2.76 cm |
| Length of slots 520 | 0.46 cm |
| Thickness of ring 16 0.005 in | 0.127 mm |

Figure 11:
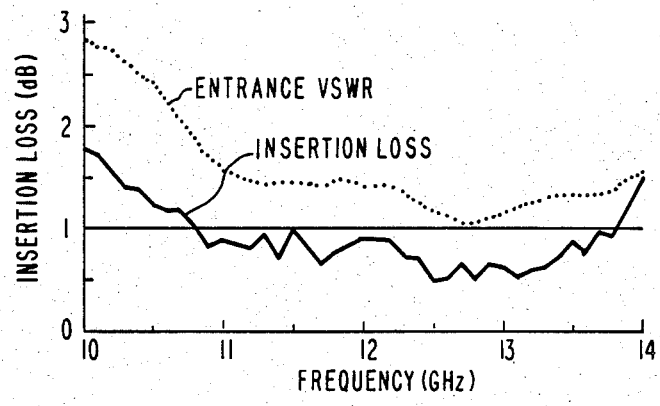
FIG. 11 is a plot of VSWR looking into the amplifier output port and of the insertion loss of the output combiner over a frequency range of 10 to 14 GHz.

FIG. 11 illustrates the VSWR at common input port 4, and the insertion loss from the common input port to one of the microstrip terminals 930 of a radial power divider such as that illustrated in FIG. 2 over a frequency range extending from 10 to 14 GHz. The VSWR was measured with each of the microstrip terminals associated with printed circuit board 28 terminate in a resistor matching the characteristic impedance of the microstrip transmission line. The insertion loss plot was generated by measuring the power received at each microwave terminal associated with circuit board 28 with the remainder of the microstrip terminals terminated in approximately their characteristic impedance. A calculation was then made for each frequency, adding together the power received at each of the microstrip terminals and comparing the sum so calculated to the input power. The difference is the insertion loss illustrated in FIG. 11. This insertion loss includes a component due to reflection and a component due to dissipation ($I^2R$) losses.

Figure 12:
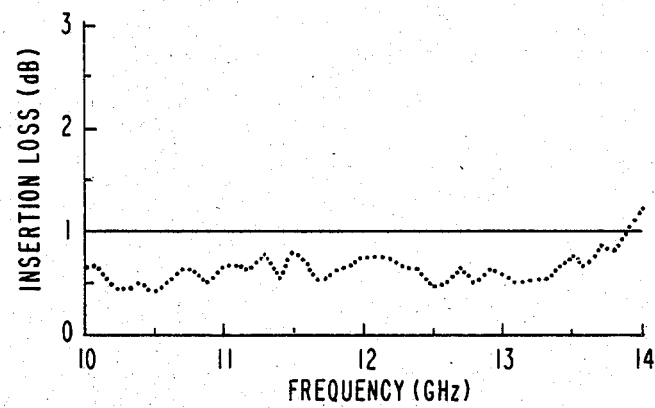
FIG. 12 is a plot of the heating or $I^2R$ component of the insertion loss of FIG. 11.

FIG. 12 plots insertion loss versus frequency but with the effect of reflection loss due to the entrance VSWR eliminated. Thus, the plot of FIG. 12 is essentially the dissipation losses of the power divider of FIG. 2.

Figure 13:
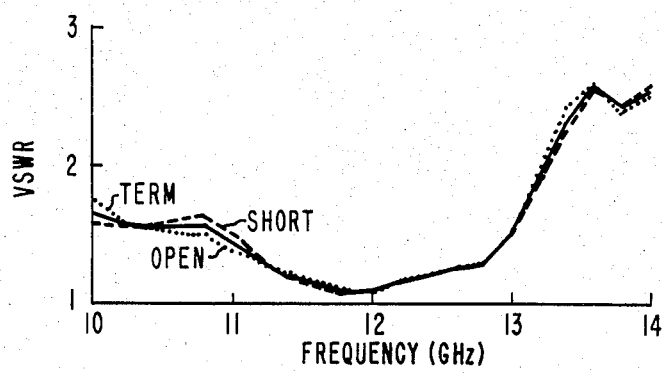
FIG. 13 plots as a function of frequency the VSWR looking into a microstrip port of the power combiner portion of the power amplifier for various terminations of an adjacent microstrip terminal.

FIG. 13 is a plot of the VSWR looking into one microstrip terminal 422 with the common output port of the amplifier terminated and with the remaining 29 microstrip terminals 422 terminated. Also included are plots for the case where an adjacent microstrip terminal 422 is open-circuited and short-circuited. It can be seen that the VSWR is not materially affected by shorting or opening an adjacent microstrip port over the frequency range of 10 to 14 GHz.

Figure 14:
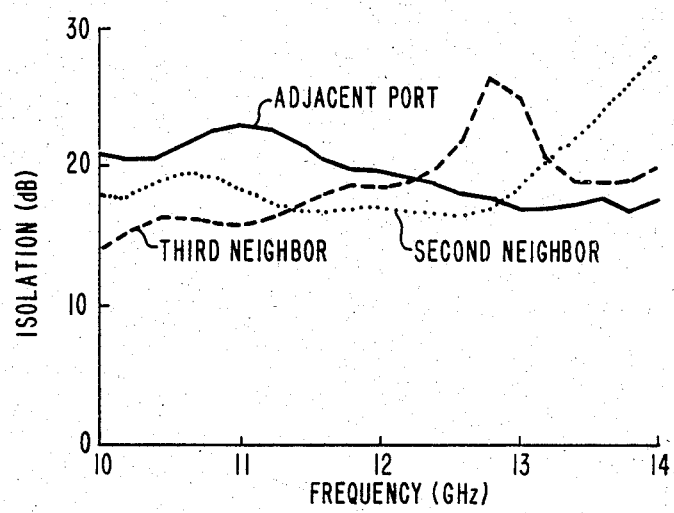
FIG. 14 plots as a function of frequency the isolation from one microstrip terminal of the power combiner to adjacent ports.

FIG. 14 illustrates the isolation or attenuation between a microstrip terminal 422 and adjacent, semi-adjacent or third neighboring microstrip ports with the remainder of the microstrip ports and the common output port terminated.

Figure 15:
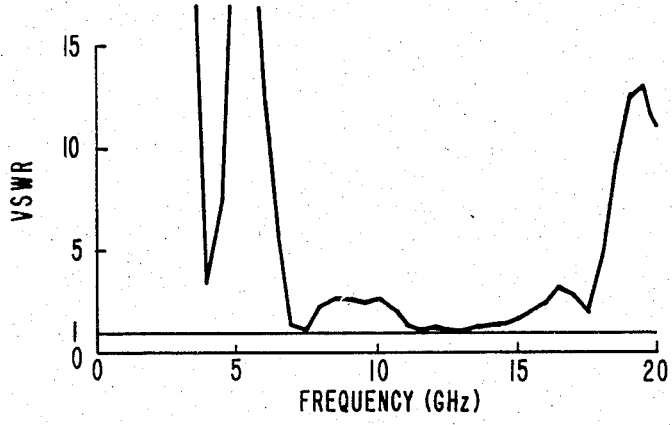
FIG. 15 plots as a function of frequency the VSWR looking into the common output port of the power combiner.

FIG. 15 illustrates the entrance VSWR of a power combiner or splitter as in FIGS. 1 and 2, respectively, over a broad frequency range. The high VSWR below 7 GHz and above 17 GHz is attributed to the impedance transformers.

Other embodiments of the invention will be obvious to those skilled in the art. For example, a carrier for each amplifier module such as carrier 810 of FIG. 8 is not necessary but is merely convenient. Upper surface 50 of central disc-like member 10 may continue from the radial transmission line and under the amplifier modules without a step in level, if desired. The input and output transmission lines may include tapered rather than stepped impedance transformation, or may include no transformation at all. More or less amplifier modules than 30 may be used, and auxiliary cooling methods such as water cooling or convection cooling may also be used. If convenient, one bias voltage feed through a filter such as 720 may serve a plurality of amplifier modules. Printed circuit board 28 may have the same diameter as board 18, and a second set of amplifier modules may be coupled to bottom surface 52 of central member 10, arranged with their inputs coupled to receive divided signal from microstrip terminals 930 and their outputs driving coaxial transmission lines 708, thereby effectively cascading each amplifier module 40 on the top surface of central number 10 with a further amplifier module on the bottom surface.

What is claimed is:
1. An amplifier, comprising:
an electrically conductive central disc-like member including a central axis and also including first and second flat sides which are parallel to a plane orthogonal to said central axis;
an input port adapted for receiving signal to be amplified and for coupling said signal to be amplified to a point near the junction of said central axis and said first flat side of said central disc-like member;
power splitting means coupled to said input port and including a first flat conductive member spaced from said first flat side of said central disc-like member to form a first radial transmission line for conveying said signal to be amplified from said input port to points at a first radius therefrom, and also including radial transmission line to microstrip transition means for splitting said signal to be amplified into a first plurality of portions, each of said portions appearing on one of a first plurality of first microstrip terminals equally spaced along a circle spaced by a second radius from said central axis;
a second plurality of second microstrip terminals spaced by a predetermined distance from said second side of said central disc-like member;
an output port;
power combining means coupled to said output port and including a second flat conductive member spaced from said second flat side of said central disc-like member to form a second radial transmission line, and also including microstrip to radial transmission line transition means coupled to said second microstrip terminals and to said second radial transmission line for coupling to said output port combined signal from said second microstrip terminals; and
a third plurality of amplifier modules, said third plurality being equal to each of said first and second pluralities, each of said amplifier modules including an input terminal coupled to one of said first microstrip terminals and an output terminal coupled one of said second microstrip terminals, each of said amplifier modules also being biased to amplify one of said first plurality of portions of said signals received from said one of said first microstrip terminals to produce an amplified signal at said one of said second microstrip terminals, whereby heat is produced by said bias;
wherein in order to reduce signal power losses at the junction between said output terminal of each of said third plurality of amplifier modules and the corresponding one of said second microstrip terminals of said power combining means and in order to effectively couple heat from said amplifier modules;
each of said amplifier modules includes a flat side and is mounted with said flat side abutting said second side of said central disc-like member with said out- put terminal immediately adjacent to and in electrical contact with said corresponding one of said second microstrip terminals;

each one of said first microstrip terminals of said power splitting means is coupled to said input terminals of a corresponding one of said third plurality of amplifier modules by means of a coaxial transmission-line passing through said central disc-like member orthogonal to said first plane; and said central disc-like member is thermally conductive and the periphery of said central disc-like member is coupled to heat-sinking means.

2. An amplifier according to claim 1 wherein said input port is a coaxial port and comprises an inner conductor coaxial with said central axis and terminating on said first flat side of said central disc-like member and an outer conductor coaxial with said inner conductor and terminating at said flat conductive member.

3. An amplifier according to claim 1 wherein said first flat conductive member comprises printed-circuit conductor bonded to a surface of a dielectric material, said dielectric material being supported on said first flat side of said central disc-like member, and said radial transmission line to microstrip transition means comprises elongated conductive fingers spaced radially about and extending from the outer periphery of said first flat conductive member to said first microstrip terminals.

4. An amplifier according to claim 3, wherein said radial transmission line to microstrip transition means further comprises radial slots formed in said first flat conductive member between said elongated conductive fingers, each of said radial extending from said outer periphery of said first flat conductive member a distance equal to one quarter wavelength at a design center frequency of operation.

5. An amplifier according to claim 4 further comprising damping means coupled to said radial slots for attenuating signals due to unwanted operating modes.

6. An amplifier according to claim 5 wherein each said damping means comprises resistance means coupled across the end of each of said radial slots adjacent said outer periphery of said first flat conductive member.

7. An amplifier according to claim 6 wherein each said resistance means comprises:

first and second resistors, each of which has first and second connection terminals, said first terminals of each of said first and second resistors being coupled to first and second sides of each said radial slot, respectively; and conductive means coupled to said second terminals of said first and second resistors for coupling said first and second resistors in series.

8. An amplifier according to claim 1, wherein said second flat conductive member has an outer periphery and comprises printed-circuit conductor bonded to a surface of a dielectric material, said dielectric material being supported on said second flat side of said central disc-like member, and said microstrip to radial transmission line transition means comprises elongated conductive fingers spaced radially about and extending from said second microstrip terminals to said outer periphery of said second flat conductive member.

9. An amplifier according to claim 8, wherein said microstrip to radial transmission line transition means further comprises radial slots formed in said second flat conductive member between said elongated conductive fingers, each of said radial slots extending from said outer periphery of said second flat conductive member a distance equal to one quarter wavelength at a design center frequency of operation.

10. An amplifier according to claim 9 further comprising damping means coupled to said radial slots for attenuating signals due to unwanted operating modes.

11. An amplifier according to claim 8 wherein said dielectric material extends beyond said outer periphery of said second flat conductive member, and said elongated conductive fingers are printed onto said dielectric material.

12. An amplifier according to claim 11 wherein said input terminal of each said amplifier module is a microstrip input terminal and each said output terminal of each said amplifier module is a microstrip output terminal.

13. An amplifier according to claim 12 wherein said output microstrip terminal of each of said amplifier modules lies in the same plane as the plane of said second microstrip terminals.

14. An amplifier according to claim 1 further comprising heat-sinking means coupled to the outer periphery of said central disc-like member.

15. An amplifier according to claim 14 wherein said heat sinking means comprises thermally conductive means.

16. A power amplifier comprising:

an input port centered on an axis and adapted for receiving signal to be amplified;

a first radial transmission line centered on said axis and coupled to said input port for propagating said signal to be amplified radially away from said input port;

radial transmission line to microstrip transition means centered on said axis and coupled to said radial transmission line for coupling a portion of said signal to be amplified to each of a first plurality of microstrip terminals;

a plurality equal to said first plurality of coaxial transmission lines, each of said coaxial transmission lines having a first end and a second end, each of said first ends being coupled to one of said first microstrip terminals, and each of said coaxial transmission lines extending at right angles thereto and parallel with said axis;

an output port on said axis;

a second radial transmission line centered on said axis and coupled to said output port for propagating amplified signal to said output port;

microstrip transmission line to radial transmission line transition means centered on said axis for receiving portions of said amplified signal at a plurality equal to said first plurality of second microstrip terminals and for coupling said portions of said amplified signal to said second radial transmission line; and a plurality equal to said first plurality of amplifying means, each of said amplifying means having an input terminal coupled to said second end of one of said coaxial transmission lines for receiving one of said portions of said signal to be amplified, and each of said amplifying means having an output terminal coupled to one of said second microstrip terminals for producing one of said portions of said amplified signal.

17. An amplifier, comprising:

an electrically conductive central disc-like member including a central axis and also including first and second flat sides which are parallel to a plane orthogonal to said central axis;

an input port adapted for receiving signal to be amplified and for coupling said signal to be amplified to a point near the junction of said central axis and said first flat side of said central disc-like member;

power splitting means coupled to said input port and including a first flat conductive member spaced from said first flat side of said central disc-like member to form a first radial waveguide for conveying said signal to be amplified from said input port to points at a first radius therefrom, and also including radial-waveguide-to microstrip transition means for splitting said signal to be amplified into a first plurality of portions, each of said portions appearing on one of a first plurality of first microstrip terminals equally spaced along a circle spaced by a second radius from said central axis;

a second plurality of second microstrip terminals spaced by a predetermined distance from said second side of said central disc-like member;

an output port;

power combining means coupled to said output port and including a second flat conductive member spaced from said second flat side of said central disc-like member to form a second radial waveguide, and also including microstrip-to-radial-waveguide transition means coupled to said second microstrip terminals and to said second radial waveguide for coupling to said output port combined signal from said second microstrip terminals; and a third plurality of amplifier modules, said third plurality being equal to each of said first and second pluralities, each of said amplifier modules including an input terminal coupled to one of said first microstrip terminals and an output terminal coupled one of said second microstrip terminals, each of said amplifier modules also being biased to amplify one of said first plurality of portions of said signals received from said one of said first microstrip terminals to produce an amplified signal at said one of said second microstrip terminals, whereby heat is produced by said bias;

wherein in order to reduce signal power losses at the junction between said output terminal of each of said third plurality of amplifier modules and the corresponding one of said second microstrip terminals of said power combining means and in order to effectively couple heat from said amplifier modules;

each of said amplifier modules includes a flat side and is mounted with said flat side abutting said second side of said central disc-like member with said output terminal immediately adjacent to and in electrical contact with said corresponding one of said second microstrip terminals;

each one of said first microstrip terminals of said power splitting means is coupled to said input terminals of a corresponding one of said third plurality of amplifier modules by means of a coaxial transmission-line passing through said central disc-like member orthogonal to said first plane; and said central disc-like member is thermally conductive and the periphery of said central disc-like member is coupled to heat-sinking means.

* * * * *